(12) United States Patent
Yamada et al.

(10) Patent No.: US 7,064,516 B2
(45) Date of Patent: Jun. 20, 2006

(54) MOTOR DRIVER

(75) Inventors: Yuuichi Yamada, Yamanashi (JP); Naoto Ota, Funabashi (JP); Takashi Harada, Yamanashi (JP); Mamoru Yaeshima, Hadano (JP)

(73) Assignee: Fanuc LTD, Yamanashi (JP)

( * ) Notice: Subject to any disclaimer, the term of this patent is extended or adjusted under 35 U.S.C. 154(b) by 0 days.

(21) Appl. No.: 10/952,795

(22) Filed: Sep. 30, 2004

(65) Prior Publication Data

US 2005/0068000 A1    Mar. 31, 2005

(30) Foreign Application Priority Data

Sep. 30, 2003    (JP) .............................. 2003-340009

(51) Int. Cl.
    *H02P 27/04*    (2006.01)
(52) U.S. Cl. ...................... 318/802; 318/800; 318/803; 318/805; 318/806
(58) Field of Classification Search ................ 318/802, 318/801, 800, 803, 805, 806, 812; 363/58, 363/55
    See application file for complete search history.

(56) References Cited

U.S. PATENT DOCUMENTS

| | | | | |
|---|---|---|---|---|
| 5,430,636 A | * | 7/1995 | Kachi .......................... | 363/58 |
| 6,437,575 B1 | * | 8/2002 | Lin et al. ..................... | 324/433 |
| 6,445,598 B1 | * | 9/2002 | Yamada .................... | 363/21.12 |
| 2003/0043610 A1 | * | 3/2003 | Akita et al. ................. | 363/131 |

FOREIGN PATENT DOCUMENTS

| | | |
|---|---|---|
| EP | 0 571 657 | 9/1992 |
| JP | 5-336759 | 12/1993 |
| JP | 10-221395 | 8/1998 |
| JP | 2001-141795 | 5/2001 |
| JP | 2003-098217 | 4/2003 |
| JP | 2003-177754 | 6/2003 |

* cited by examiner

*Primary Examiner*—Karen Masih
(74) *Attorney, Agent, or Firm*—Staas & Halsey LLP

(57) ABSTRACT

While the motor drive amplifier is not operating, electromagnetic switch contacts are held closed for a predetermined period of time, three-phase power is rectified by a rectifier circuit and a smoothing capacitor is charged. Then, the smoothing capacitor is discharged through a discharging resistor and, when a predetermined voltage is reached, a contact is closed, with the result that a closed circuit is formed by the smoothing capacitor, a detection resistor, a motor coil, motor insulation resistance, and ground. A voltage generating across the detection resistor due to leakage current is detected and compared with a reference value. If the detected voltage exceeds the reference value, an insulation degradation signal is delivered.

9 Claims, 3 Drawing Sheets

MOTOR DRIVER

BACKGROUND OF THE INVENTION

1. Field of the Invention

The present invention relates to a motor driver capable of detecting motor insulation deterioration.

2. Description of the Related Art

Over many years of use, the insulation of a motor deteriorates depending on the environment in which the motor is used and other conditions. If current leaks due to insulation deterioration, a leakage current circuit breaker operates and abruptly stops the operation of the apparatus using the motor. In this case, it takes long time to find the cause of such abrupt stop, as it is unknown whether the problem derives from the motor or the motor driver, with the result that the interruption of the apparatus or production line using the motor tends to extend for a long period of time.

Motor insulation deterioration is generally detected by detecting the leakage current, as described above. Conventional devices for detecting leakage current, such as leakage current detectors and leakage current protection relays, have the drawback of being unable to detect leakage current until insulation deterioration is in an advanced stage, because the detection threshold is normally approximately 15 mA in small detectors, and approximately 3 mA in the smallest detectors. Another drawback of conventional leakage current detectors is that when an apparatus or production line suddenly stops due to leakage current, the entire system operation of the apparatus or production line has to be stopped to investigate whether the problem derives from the motor itself, the motor driver, or a peripheral device. A further drawback of conventional leakage current detection devices is that they are not useful for predicting insulation deterioration for preventive maintenance of the motor.

A method for detecting an insulation deterioration of a compressor motor for an air conditioner at an early stage so as to prevent the air conditioner from becoming inoperative is disclosed in Japanese Patent Application Laid-open No. 2001-141795. According to this method, high frequency pulses are applied to one transistor constituting a power inverter so as to cause leakage current (including current caused by insulation deterioration) to flow into a motor while the motor is not in operation. This inverter changes the voltage of a DC power supply, produced by rectifying and filtering a three-phases AC power supply, into an arbitrary voltage and frequency for driving the motor. An insulation resistance value is computed from the voltage of the DC power supply inputted to a voltage detector and the motor current detected by a current detector. If the computed insulation resistance value is below a predetermined insulation resistance value, an alarm is issued. Another method for predicting insulation deterioration is also disclosed in the above patent document, which computes the insulation resistance value of a motor by simply bringing the transistor into conduction, instead. of applying high frequency pulses to the transistor.

According to the methods described above in the patent document, although useful for predicting and preventing motor insulation deterioration and for preventive maintenance of the motor, detection of voltages and currents are required. Detectors for this purpose must allow for high current, which becomes a cost-raising factor.

In view of the above drawbacks of conventional motor insulation deterioration detection methods, a less expensive motor driver that eliminates these drawbacks and enables insulation deterioration to be predicted has been developed and a patent has been applied for (Japanese patent application No. 2003-177754).

In the motor driver proposed in this Japanese patent application, DC power supply, produced by rectifying the voltage between a grounded AC power supply and the ground, is applied to a through a detection resistor, and the potential difference across the detection resistor is measured to detect motor insulation deterioration. In the motor driver proposed in this Japanese patent application, the voltage applied for detection of insulation resistance becomes a three-phase half-wave rectified voltage in the case of a neutral grounded AC power supply, while it becomes a three-phase half-wave rectified voltage in which one phase out of three phases lacks in the case of a single-line grounded AC power supply, which leads to generation of pulse-shaped voltage, causing a trouble.

In the case of a neutral grounded AC power supply, the applied voltage becomes a three-phase half-wave rectified voltage and is smoothed by a capacitor into a smooth DC voltage. This smooth DC voltage is applied to a series circuit formed by a detection resistor and an insulation resistance of the motor. If the motor insulation resistance lowers, the potential difference across the detection resistance lowers, with the result that the motor insulation deterioration is detectable. In the case of single-line grounded AC power supply, however, the applied voltage is pulse-shaped and is affected by a parasitic capacitance which exists together with, and in parallel with, the motor insulation resistance.

FIG. 4 illustrates the principle of motor insulation resistance measurement in the motor driver proposed in the above Japanese patent application. Reference numeral 51 denotes a three-phase AC power supply and reference numeral 54 denotes electromagnetic switch contacts. Reference numeral 52 denotes a rectifier circuit in the power supply section of the motor driver, which corresponds to the power supply section 6 (to be described later) in FIG. 1. Reference numeral 53 denotes an equivalent circuit representation of the motor drive amplifier, corresponding to the inverter circuit in the motor drive amplifier 8 in FIG. 1. Symbols D51 and D52 denote diodes in the inverter circuit of the motor drive amplifier. Diode D51 corresponds to diodes D11, D12 and D13 in the motor drive amplifier 8 in FIG. 1, and diode D52 corresponds to diodes D14, D15 and D16 in the motor drive amplifier 8 in FIG. 1. Resistors R51 and R52 are equivalent resistors indicating leakage current in the switching elements in the inverter circuit. Resistor R51 corresponds to switching elements Q11, Q12 and Q13 in FIG. 1, and resistor R52 corresponds to switching elements Q14, Q15 and Q16. Symbol RM denotes an insulation resistance between the motor and ground. Symbol CM denotes a parasitic capacitance between the motor and ground. In the motor driver proposed in this Japanese patent application, motor insulation resistance is measured by connecting one phase coil of the motor to the negative-side output line of the rectifier circuit 52 in the power supply section, through the detection resistor R1.

When a motor driver to which such a motor insulation resistance measurement device is attached is connected to the single-line grounded three-phase AC power supply 51 and the electromagnetic switch contacts 54 are closed, a closed circuit is formed in the motor driver by the rectifier circuit 52 in the power supply section, protection resistor R2, detection resistor R1, motor winding (insulation resistance RM between the motor and ground, parasitic capacitance CM between the motor and ground), and grounds G2 and G1, in which three-phase half-wave rectification is performed.

Because the AC power supply 51 has one line grounded, however, a voltage for one phase is removed from among those for three phases and the pulse-shaped waveform P1 shown in FIG. 5, in which the zero potential appears, is applied to the motor. If the motor driver is connected to a neutral-grounded three-phase AC power supply (as in the case disclosed in the above Japanese patent application), a relatively smooth voltage such as one shown by P2 in FIG. 5 is applied to the motor. The voltage waveforms P1 and P2 in FIG. 5 represent peak values of ideal voltage waveforms when a three-phase AC power supply 51 has a phase voltage E of 115 V, rectified with forward voltage drops across diodes in the rectifier circuit and line voltage drops ignored.

If there is no parasitic capacitance CM between the motor and ground, single-line grounded AC power supply and neutral grounded AC power supply produce the same average voltage as far as their phase voltages E are the same, although their peak voltages differ from each other. As a result, motor insulation resistance and its deterioration can be detected at substantially the same level, regardless of how the AC power supply is grounded, by adding a capacitor to the detection resistor R1 to take the average voltage.

In the case of a single-line grounded AC power supply, if there is a parasitic capacitance CM between the motor and ground, the AC power supply produces a pulse-shaped waveform, so that charging takes place only during the width of the pulses and the capacitance CM is alternately charged and discharged. Further, the greater the capacitance CM is, the lower the charging voltage is, resulting in a lower voltage being applied to the motor. If a lower voltage is applied to the motor, the potential difference across the detection resistor increases because the detection resistor is connected in series with the parallel circuit formed by the motor insulation resistance RM and the capacitance CM. Accordingly, to detect a predetermined level of motor insulation resistance, it is necessary to change the value of the detection resistor according to the value of the capacitance CM, or change the reference voltage value to be compared with the voltage detected by the detection resistor. It is difficult, however, to change the values of the detection resistor and reference voltage, because the value of the capacitance CM is unknown.

An insulation tester (megger) for measuring the insulation resistance of the motor to ground uses a smooth DC voltage for detection. Such an insulation tester does not use a pulse-shaped voltage for detection of a motor insulation resistance. Accordingly, if a megger is used to detect an insulation resistance deterioration of the motor in the case of a single-line grounded AC power supply, a conversion table is required for each type of motor.

SUMMARY OF THE INVENTION

A motor driver according to the present invention comprises a power supply section in which the power supplied from an AC power supply through a switch is rectified by a rectifier circuit and smoothed by a capacitor; a motor drive amplifier in which a DC voltage from the power supply section is inverted to an AC voltage to drive a motor; a detection resistor connected in series with a motor coil; voltage applying means for connecting the rectifier circuit to ground, after operating the switch for a certain period of time, to store energy in the capacitor, and then applying energy stored in the capacitor through the detection resistor to the motor; and a voltage detection circuit detecting a potential difference across the detection resistor.

The voltage detected by the voltage detection circuit is compared with a reference value in a comparator. If the detected voltage exceeds the reference voltage, an abnormality is indicated on display means. Alternatively, the voltage detected by the voltage detection circuit is converted into a digital signal by an A/D converter and this converted voltage value is displayed by the display means.

Instead of connecting the rectifier circuit in the voltage applying means directly to ground, a DC power supply may be added, having one output connected to the rectifier circuit and the other output connected to ground. The voltage applying means also includes voltage detecting means for detecting the voltage of the rectifier circuit, generated after operation of the switch for a certain period of time, so that energy stored in the capacitor is applied to the motor through the detection resistor when the voltage detecting means detects a predetermined level of voltage.

According to the present invention, as the motor driver with the above configuration rectifies the voltage from the AC power supply to store it in the capacitor and uses the stored power as the power supply for measuring the insulation resistance of the motor, motor insulation resistance to ground can be measured and the insulation deterioration can be detected for any types of AC power supply used in a motor driver, regardless of how the AC power supply is grounded.

BRIEF DESCRIPTION OF THE DRAWINGS

The forgoing and other objects and feature of the invention will be apparent from the following description of preferred embodiments of the invention with reference to the accompanying drawings, in which.

DESCRIPTION OF THE EMBODIMENTS

Figure 1:
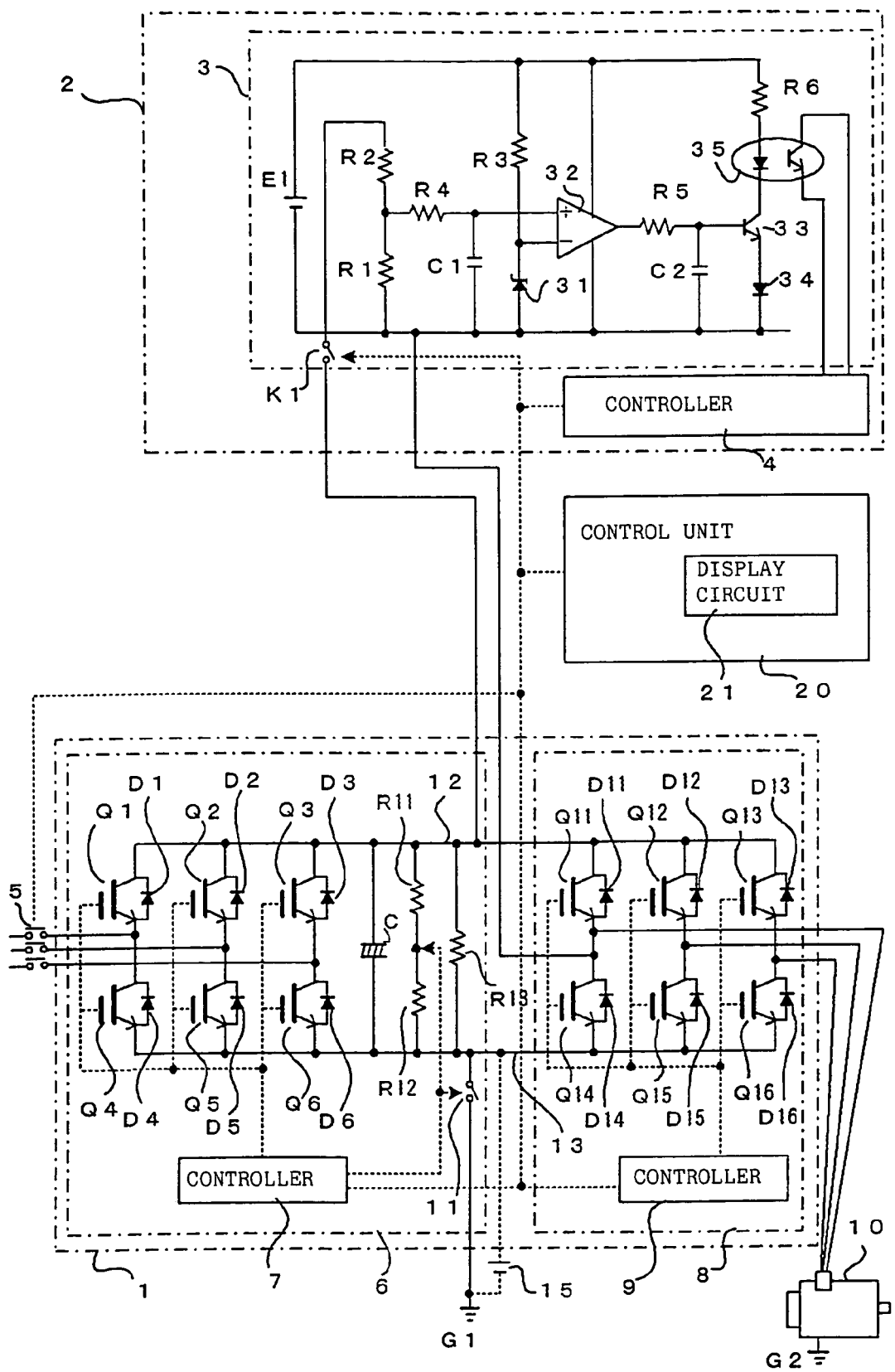
FIG. 1 is a block circuit diagram illustrating essential components of the motor driver according to a first embodiment of the present invention.

FIG. 1 is a block circuit diagram illustrating essential components of the motor driver according to a first embodiment of the present invention. As shown in FIG. 1, the motor driver unit 1 consists of a power supply section 6 including a rectifier circuit for converting a three-phase AC power supply to a DC power supply; and a motor drive amplifier 8 for inverting the DC power supply to the AC power supply required for driving a motor 10. In the present invention, a motor insulation resistance detector 2 is added to the motor driver unit 1. The motor insulation resistance detector 2 consists of a voltage detection circuit 3 and a controller 4.

The power supply section 6 in the motor driver unit 1 includes a rectifier circuit comprising diodes D1 to D6 for rectifying and converting power supplied through electromagnetic switch contacts 5 from a three-phase AC power supply to a DC power supply; and switching elements Q1 to Q6, each of which is an IGBT or the like, connected in parallel with the diodes D1 to D6 for feeding back regenerative current to the AC power supply. The power supply section 6 further includes a smoothing capacitor C for smoothing the rectified DC voltage outputted from the rectifier circuit including the diodes D1 to D6. The voltage across the smoothing capacitor C is divided by resistors R11 and R12 and used by a controller 7 to start the operation of detecting motor insulation resistance.

The motor drive amplifier 8 includes an inverter circuit consisting of switching elements Q11 to Q16, each of which is an IGBT or the like, and diodes D11 to D16 connected in parallel with respective switching elements Q11 to Q16. The motor drive amplifier 8 also includes a controller 9.

Output lines 12, 13 (in the DC link section) of the rectifier circuit in the power supply section 6 are connected to the motor drive amplifier 8 and supply the DC voltage to the motor drive amplifier 8. A discharging resistor R13 for discharging the smoothing capacitor C is connected between the output lines 12 and 13 in the DC link section. The negative-side output line 13 in the power supply section 6 is connectable to ground via a relay contact 11.

The controller 7 in the power supply section 6 and the controller 9 in the motor drive amplifier 8 are both connected to a control unit 20 that controls the motor driver. The controller 9 controls on/off operations of the switching elements Q11 to Q16 according to commands from the control unit 20, to control the driving of the motor 10. The commands from the control unit 20 also control on/off operation of the electromagnetic switch contacts 5.

Although the motor driver unit 1 described above has substantially the same configuration as that of a conventional motor driver, the motor driver of the present invention is characterized in that the discharging resistor R13 is connected between the output lines 12 and 13 in the DC link section, the negative-side output line 13 in the DC link section is connectable to ground via the relay contact 11, and the motor insulation resistance detector 2 for measuring the insulation resistance of the motor is added to the motor driver unit 1.

The voltage detection circuit 3 in the motor insulation resistance detector 2 is connected to one phase line connecting the inverter circuit in the motor drive amplifier 8 to a coil of the motor 10 and to a positive-side output line 12 in the DC link section.

In the voltage detection circuit 3, symbol K1 denotes a contact of a relay incorporated into the controller 4, symbols R1 to R6 denote resistors, symbols C1 and C2 denote capacitors, reference numerals 31, 32, 33, 34 and 35 denotes a Zener diode, comparator, transistor, diode, and opto-isolator, respectively. While the inverter circuit in the motor drive amplifier 8 of the motor driver unit 1 is not operating, the voltage detection circuit 3 closes the relay contact K1 and measures the motor insulation resistance by means of a potential difference across the resistor R1.

How the insulation resistance of the motor connected to the motor driver is measured and insulation deterioration is detected will be described next. To measure insulation resistance of the motor, the electromagnetic switch contacts 5 are closed according to a command from the control unit 20. The power from the three-phase power supply is rectified by diodes D1 to D6 and charges the smoothing capacitor C. After a certain period of time, the smoothing capacitor C is fully charged. If its capacitance is sufficient, the smoothing capacitor C discharges a smooth DC voltage with minimum ripple. Given that the smoothing capacitor C has adequate capacitance and has been fully charged, a smooth DC voltage is gradually discharged through the discharging resistor R13. This voltage is divided by resistors R11 and R12 and the divided voltage is detected by the controller 7 in the power supply section 6. When the voltage detected by the controller 7 reaches a preset value, the controller 7 closes the relay contact 11 to connect the power supply output line 13 (negative-side line) to ground and sends a command signal for starting the insulation resistance measurement to the controller 4 in the motor insulation resistance detector 2.

This method, consisting of steps of discharging the energy charged in the smoothing capacitor C through the discharging resistor R13, dividing the generated voltage using the resistors R11 and R12, detecting the divided voltage, and issuing a command signal to start the insulation resistance measurement when the divided voltage reaches a preset value, is particularly useful for a motor driver adapted to multiple specifications, for example, with a motor driver unit 1 accepting 200 V and 400 V power supplies, because the insulation resistance measurement can be started at different times by simply changing the preset voltage. The discharging resistor R13 does not have to be added specially for the present invention; an existing resistor installed for discharging energy from the smoothing capacitor C may be used.

In response to the command signal for starting insulation resistance measurement, the controller 4 in the insulation resistance detector 2 closes the contact K1 to apply the voltage to which the smoothing capacitor C has been charged through the detection resistor R1 to the motor 10. At this moment, a closed circuit is formed by the positive-side terminal of the smoothing capacitor C, the positive-side output line 12 in the DC link section, relay contact K1, protection resistor R2, detection resistor R1, one phase winding of motor 10, the insulation resistance of the motor 10 (including its parasitic capacitance), grounds G2 and G1, contact 11, and the negative-side terminal of smoothing capacitor C. As the smoothing capacitor C, motor insulation resistance to ground, and the detection resistor R1 are connected in series, the potential difference across the detection resistor R1 varies with the magnitude of the leakage current flowing through this closed circuit and the motor insulation resistance to ground is measured as the magnitude of the potential difference. If the motor insulation resistance to ground drops, the current (leakage current) increases and the potential difference across the detection resistor R1 increases accordingly.

If the potential difference across the detection resistor R1 does not exceed the reference voltage determined by the zener diode 31, the comparator 32 does not output a signal. On the other hand, if the insulation resistance of the motor 10 deteriorates and its insulation resistance to ground drops, more current flows and the potential difference across the detection resistor R1 exceeds the reference voltage, which causes the comparator 32 to output a signal to turn on a transistor 33. As a result, current flows into the light emitting element in the opto-isolator 35, the output signal from the opto-isolator 35 is inputted through the controller 4 to the control unit 20, and an indication of degraded motor insulation resistance to ground is displayed on a display circuit 21. Seeing this indication, an operator can take action such as replacing the motor 10. After the contact K1 is closed, the voltage detected by the detection resistor R1 initially fluctuates while the parasitic capacitance between the motor and ground is being charged; the operator preferably waits for the parasitic capacitance between the motor and ground to be fully charged and the voltage detected by the detection resistor R1 to be stabilized before deciding whether motor insulation resistance to ground has deteriorated.

As described above, the motor driver shown in FIG. 1 enables motor insulation resistance to ground to be measured easily and enables motor insulation degradation or deterioration to be detected for preventive maintenance of the motor. As the energy stored in the smoothing capacitor C is used for measuring the insulation resistance of the motor, motor insulation resistance to ground can be measured easily and motor insulation deterioration detected, regardless of the type of three-phase AC power supply connected to the motor driver unit 1, e.g., regardless of whether it has a neutral grounded or single line grounded.

When the motor drive amplifier 8 is activated to drive the motor 10, the relay contacts K1 and 11 are left open.

In the embodiment described above, motor insulation resistance deterioration is detected by comparing the voltage detected by the detection resistor R1 with a reference voltage preset for detecting motor insulation resistance deterioration, and by determining whether the detected voltage exceeds the reference voltage or not. Alternatively, the insulation resistance of the motor may simply be detected.

Figure 2:
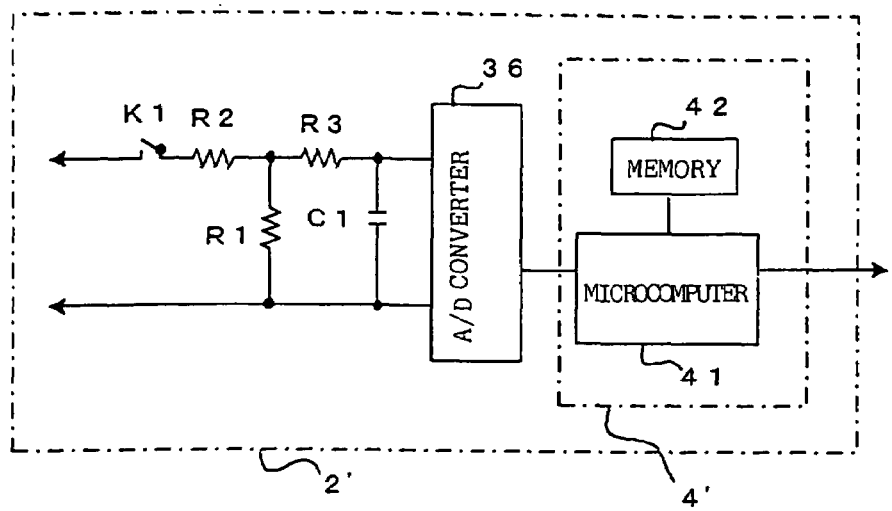
FIG. 2 is a block circuit diagram of a motor insulation resistance detector of the motor driver according to a second embodiment of the present invention.

FIG. 2 is a block circuit diagram of a motor insulation resistance detector 2' used in a motor driver according to a second embodiment of the present invention. In this embodiment, deterioration of motor insulation is detected using the motor insulation resistance detector 2' shown in FIG. 2, instead of the motor insulation resistance detector 2 used in the motor driver of the first embodiment. Deterioration of motor insulation can also be detected on the basis of the specifications (type) of the motor drive amplifier in the motor driver, or the specifications (type) of the motor.

The relay contact K1, detection resistor R1, protection resistor R2, filtering resistor R3 and capacitor C1, which constitute the motor insulation resistance detector 2' shown in FIG. 2, are the same as those components which constitute the voltage detection circuit 3 in the motor insulation resistance detector 2 shown in FIG. 1 (first embodiment). The motor insulation resistance detector 2' shown in FIG. 2, however, differs from the motor insulation resistance detector 2 (voltage detection circuit 3) shown in FIG. 1 in that the voltage across the detection resistor R1 is inputted to an A/D converter 36 for converting analog signals to digital signals. The controller 4' also differs from the controller 4 shown in FIG. 1 in that it has a microcomputer 41 and memory 42.

Reference values for displaying a motor insulation deterioration indication is stored in the memory 42 in the controller 4' in association with the specifications (type) of the motor drive amplifier 8 used in the motor driver or the specifications (type) of the motor. The controller 9 in the motor drive amplifier 8 is provided with a memory (not shown in FIG. 2) for storing the specifications (type) of the motor drive amplifier 8 or the specification of the motor.

To detect an insulation resistance to ground, a detection command for detection of an insulation resistance to ground is inputted to the control unit 20, as described above. The control unit 20 reads the specifications (type) of the motor drive amplifier from the controller 9 in the motor drive amplifier 8 and sends the read information to the controller 4' in the motor insulation resistance detector 2', and send a detection command for detection of an insulation resistance to ground.

In response to this detection command for detection of an insulation resistance to ground, the controller 4' closes the relay contact K1 to cause the A/D converter 36 to convert the potential difference across the detection resistor R1 into a digital signal. The microcomputer 41 reads the detected potential difference and writes it into the memory 42. The microcomputer 41 also reads from the memory 42 a reference value corresponding to the received specifications (type) of the motor drive amplifier or the specification of the motor, and compares the reference value with the detected potential difference. If the detected potential difference exceeds the reference value, a signal indicating deterioration of the insulation resistance to ground is sent to the control unit 20. Upon receiving this signal, the control unit 20 causes the display circuit 21 to display an indication of deterioration of the insulation resistance to ground.

Upon receiving the command from the control unit 20, the microcomputer 41 sends all of the potential difference data collected so far, or the data collected in the present detection operation and the preceding detection operation, from the memory 42 to the display circuit 21 to be displayed. As a history of the insulation resistance to ground is displayed, the progress of insulation deterioration can easily be recognized.

In the case where two or more motor drive amplifiers 8 are connected to the power supply section 6 in the motor driver unit 1, a detection circuit (relay contact K1, detection resistor R1, protection resistor R2, filtering resistor R3, capacitor C1, and A/D converter) is provided for each of these motor drive amplifiers 8, in the motor insulation resistance detector 2' to measure the insulation resistance to ground for each of the motor drive amplifiers or each of the motors, then the results of the respective measurements are stored in order and these stored data are compared with their respective reference values according to the type of the respective motor drive amplifiers 8 (or the type of the respective motors) so that an insulation deterioration is indicated in a display unit.

In the first and second embodiments described above, the negative-side output line 13 in the rectifier circuit (the DC link section) in the power supply section 6 is directly connected to ground via the relay contact 11, as shown in FIG. 1. If the negative-side output line 13 cannot be directly connected to ground via the relay contact 11, a DC power supply 15 may be added between the output line 13 and ground as shown by dotted lines in FIG. 1, connecting one terminal of the DC power supply 15 to the output line 13 and the other terminal to ground. This configuration obviously performs the same functions and actions as the embodiments described above.

Figure 3:
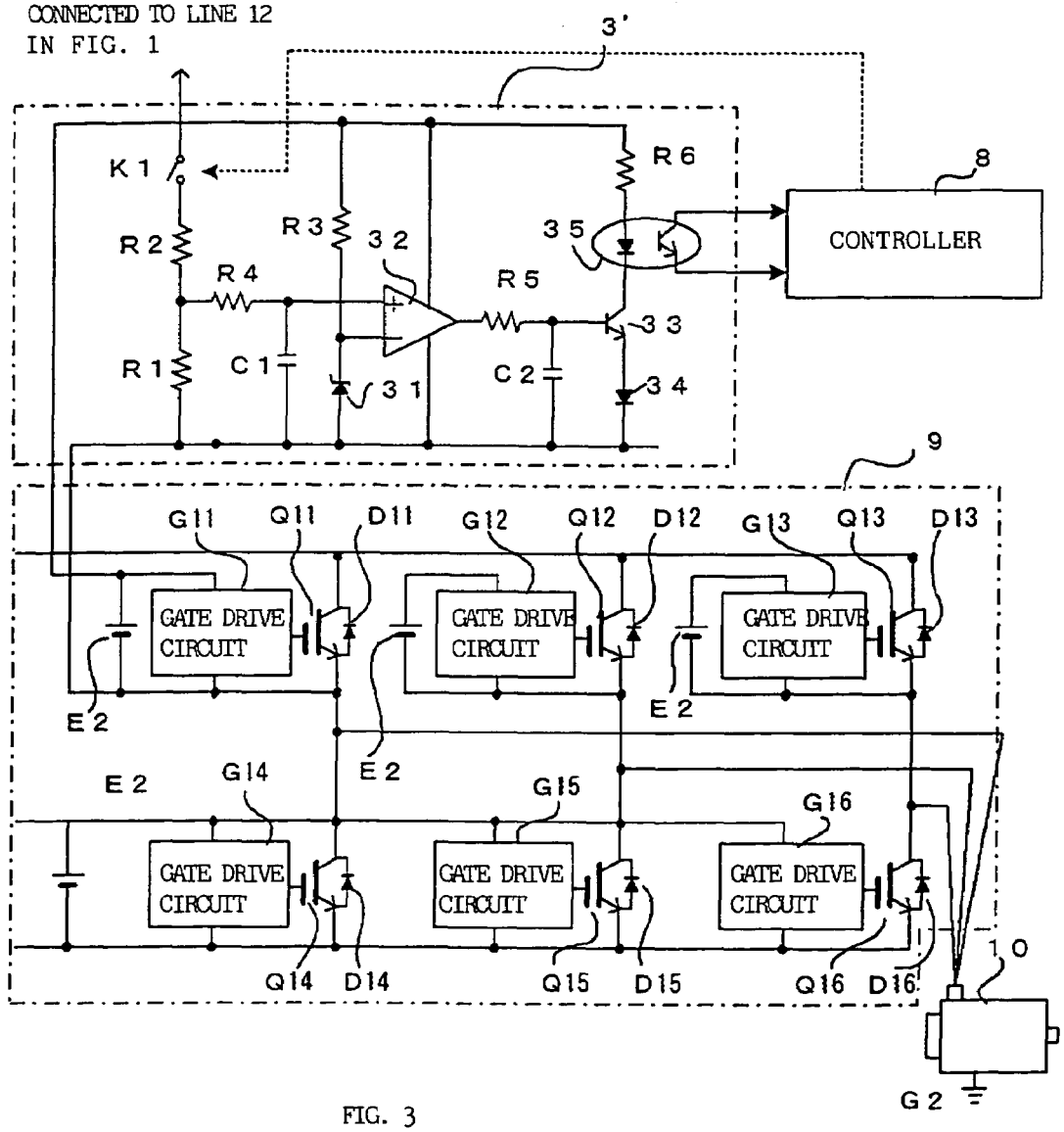
FIG. 3 is a circuit diagram illustrating essential components of the motor driver according to a third embodiment of the present invention.
Figure 4:
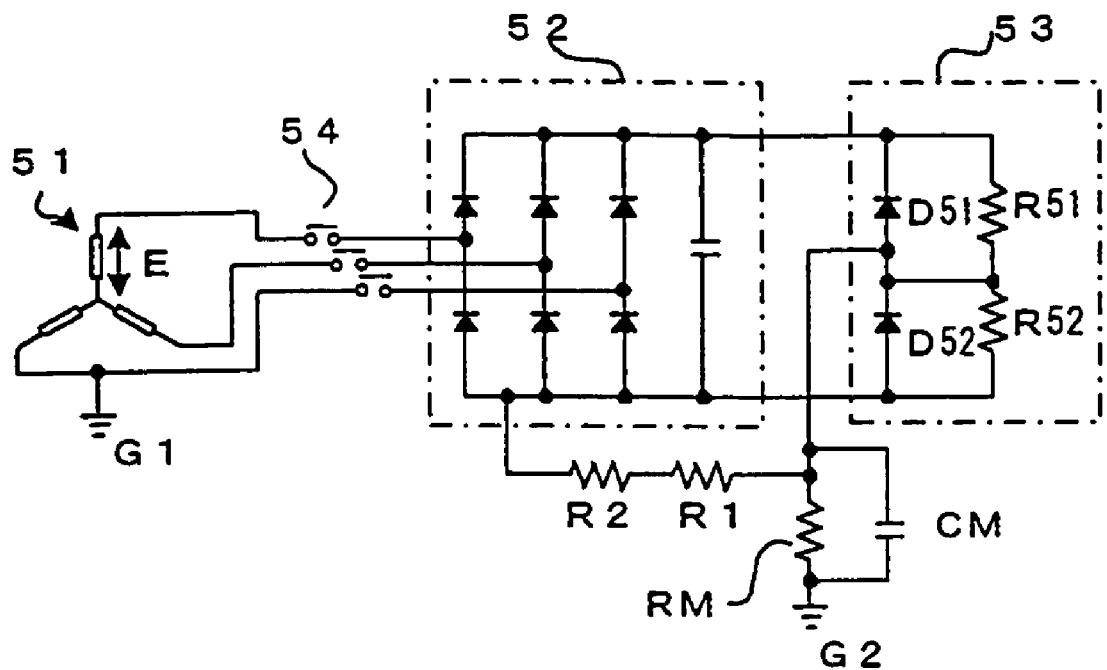
FIG. 4 illustrates the principle of motor insulation resistance measurement in the motor driver proposed by a prior Japanese patent application.
Figure 5:
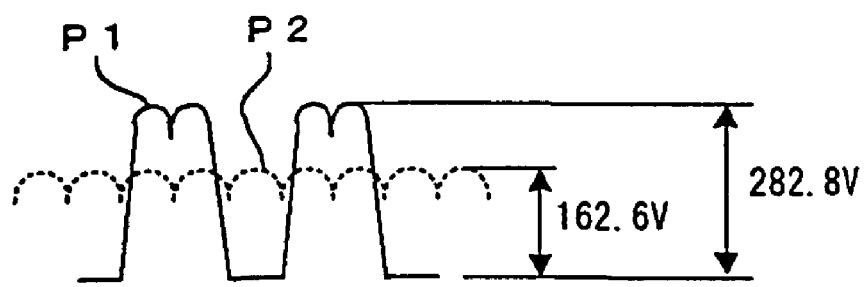
FIG. 5 shows output waveforms of a three-phase half-wave rectifier, one from an AC power supply having a single line grounded and the other from an AC power supply having a neutral grounded.

FIG. 3 is a circuit diagram illustrating essential components of a motor driver according to a third embodiment of the present invention. In the third embodiment, a voltage detection circuit 3' for detecting motor insulation deterioration is incorporated into the motor driver unit 1, in contrast to the first and second embodiments, described above, in which the voltage detection circuit 3 is externally attached to the motor driver unit 1. In the motor drive amplifier 8 shown in FIG. 3, gate drive circuits G11 to G16, which control on/off operation of switching elements Q11 to Q16 each configured by an IGBT or the like, have an independent power supply E2, respectively. One of the power supplies E2 for the gate drive circuits G11 to G16 is also used to supply power to the voltage detection circuit 3'. In these points, the voltage detection circuit 3' and motor drive amplifier 8 shown in FIG. 3 differ from the voltage detection circuit 3 and motor drive amplifier 8 in FIG. 1 in these points.

Output from the opto-isolator 35, i.e., output from the voltage detection circuit 3', is input to the controller 9 in the motor drive amplifier 8, so the controller 9 detects abnormal motor insulation resistance and sends the detection result to the control unit 20. The controller 9 also controls on/off operation of the relay contact K1 for applying charging voltage for the smoothing capacitor to the motor. With the configuration described above, a voltage detection circuit for detecting motor insulation deterioration can be incorporated into a motor driver.

What is claimed is:

1. A motor driver, comprising:
    a power supply section in which the power supplied from an AC power supply through a switch is rectified by a rectifier circuit and smoothed by a capacitor;
    a motor drive amplifier in which a DC voltage from said power supply section is inverted to an AC voltage to drive a motor;
    a detection resistor connected in series with a motor coil;
    voltage applying means for connecting said rectifier circuit to ground, after operating said switch for a certain period of time to store energy in said capacitor, and then applying energy stored in said capacitor through said detection resistor to the motor; and
    a voltage detection circuit detecting a potential difference across said detection resistor.

2. The motor driver according to claim 1, further comprising:
    a comparator comparing a voltage detected by said voltage detection circuit with a reference value; and
    display means for indicating an abnormality if the detected voltage exceeds the reference value.

3. The motor driver according to claim 1, further comprising:
    an A/D converter converting a voltage detected by said voltage detection circuit to a digital signal; and
    display means for displaying a converted voltage value.

4. The motor driver according to claim 1, comprising a DC power supply having one output connected to said rectifier circuit in said voltage applying means and the other output connected to ground, connecting said rectifier to ground.

5. The motor driver according to claim 1, wherein said voltage applying means has voltage detecting means for detecting a voltage of the rectifier circuit, generated after operation of said switch for a certain period of time, so that energy stored in said capacitor is applied to the motor through said detection resistor when the voltage detecting means detects a predetermined level of voltage.

6. The motor driver according to claim 2, comprising a DC power supply having one output connected to said rectifier circuit in said voltage applying means and the other output connected to ground, connecting said rectifier to ground.

7. The motor driver according to claim 3, comprising a DC power supply having one output connected to said rectifier circuit in said voltage applying means and the other output connected to ground, connecting said rectifier to ground.

8. The motor driver according to 2, wherein said voltage applying means has voltage detecting means for detecting a voltage of the rectifier circuit, generated after operation of said switch for a certain period of time, so that energy stored in said capacitor is applied to the motor through said detection resistor when the voltage detecting means detects a predetermined level of voltage.

9. The motor driver according to 3, wherein said voltage applying means has voltage detecting means for detecting a voltage of the rectifier circuit, generated after operation of said switch for a certain period of time, so that energy stored in said capacitor is applied to the motor through said detection resistor when the voltage detecting means detects a predetermined level of voltage.

* * * * *

UNITED STATES PATENT AND TRADEMARK OFFICE
CERTIFICATE OF CORRECTION

| | | |
|---|---|---|
| PATENT NO. | : 7,064,516 B2 | Page 1 of 1 |
| APPLICATION NO. | : 10/952795 | |
| DATED | : June 20, 2006 | |
| INVENTOR(S) | : Yuuichi Yamada et al. | |

It is certified that error appears in the above-identified patent and that said Letters Patent is hereby corrected as shown below:

Column 1, Line 9, Change "instead." to --instead--.

Signed and Sealed this

Twelfth Day of December, 2006

JON W. DUDAS
*Director of the United States Patent and Trademark Office*